(12) United States Patent
Park et al.

(10) Patent No.: US 7,304,639 B2
(45) Date of Patent: Dec. 4, 2007

(54) ACTIVE MATRIX ORGANIC ELECTROLUMINESCENT DISPLAY DEVICE AND METHOD OF FABRICATING THE SAME

(75) Inventors: Jae-Yong Park, Annyang-si (KR); So-Haeng Cho, Annyang-si (KR)

(73) Assignee: LG.Philips LCD Co., Ltd., Seoul (KR)

( * ) Notice: Subject to any disclaimer, the term of this patent is extended or adjusted under 35 U.S.C. 154(b) by 463 days.

(21) Appl. No.: 10/744,107

(22) Filed: Dec. 24, 2003

(65) Prior Publication Data

US 2005/0012694 A1 Jan. 20, 2005

(30) Foreign Application Priority Data

Dec. 31, 2002 (KR) ........................ 10-2002-0088417

(51) Int. Cl.
G09G 3/30 (2006.01)
G09G 3/38 (2006.01)

(52) U.S. Cl. ..................... 345/206; 345/76; 315/169.3

(58) Field of Classification Search ............ 345/56–84, 345/206
See application file for complete search history.

(56) References Cited

U.S. PATENT DOCUMENTS

| | | | |
|---|---|---|---|
| 5,981,973 A | 11/1999 | Matsuzaki et al. | |
| 6,281,552 B1 | 8/2001 | Kawasaki et al. | |
| 6,355,940 B1 | 3/2002 | Koga et al. | |
| 6,501,448 B1 | 12/2002 | Komiya et al. | |
| 6,512,504 B1 * | 1/2003 | Yamauchi et al. | 345/87 |
| 6,950,082 B2 * | 9/2005 | Sung et al. | 345/82 |
| 2002/0084746 A1 | 7/2002 | Anzai | |
| 2002/0158829 A1 | 10/2002 | Yamazaki et al. | |
| 2002/0195961 A1 | 12/2002 | Barth et al. | |
| 2003/0012870 A1 | 1/2003 | Sukurada | |
| 2003/0146912 A1 | 8/2003 | Sung et al. | |
| 2003/0205973 A1 | 11/2003 | Park et al. | |
| 2003/0230750 A1 | 12/2003 | Koyama et al. | |

FOREIGN PATENT DOCUMENTS

| | | |
|---|---|---|
| CN | 1367537 A | 9/2002 |
| EP | 1 150 273 | 10/2001 |
| EP | 1 193 676 | 4/2002 |
| EP | 1 193 676 A2 | 4/2002 |
| JP | 4-31299 U | 3/1992 |
| JP | 9-81053 | 3/1997 |
| JP | 2000-221903 | 8/2000 |

(Continued)

*Primary Examiner*—Duc Q Dinh
(74) *Attorney, Agent, or Firm*—Morgan, Lewis & Bockius LLP

(57) ABSTRACT

An organic electroluminescent display device includes a substrate, a gate line on the substrate, a data line crossing the gate line over the substrate, a switching thin film transistor near the crossing of the gate line and data line, a driving thin film transistor system including a plurality of sub-TFTs connected in parallel to the switching thin film transistor via a gate base, a power line crossing the gate line over the substrate and electrically connected with the plurality of sub-TFTs, a first electrode over the driving thin film transistor system in contact with the plurality of sub-TFTs, an organic electroluminescent layer on the first electrode, and a second electrode of transparent material on the organic electroluminescent layer.

11 Claims, 12 Drawing Sheets

FOREIGN PATENT DOCUMENTS

| | | |
|---|---|---|
| JP | 2000-340801 | 12/2000 |
| JP | 2001-117509 | 4/2001 |
| JP | 2001-134214 | 5/2001 |
| JP | 14-176063 | 6/2002 |
| JP | 2002-175029 | 6/2002 |
| JP | 2002-2175929 | 6/2002 |
| JP | 2002-328617 | 11/2002 |
| JP | 2003-084686 | 3/2003 |
| JP | 2003-203920 | 7/2003 |
| WO | WO 99/03087 | 1/1999 |
| WO | WO 02/091814 A2 | 11/2002 |
| WO | WO 02/099478 A1 | 12/2002 |

\* cited by examiner

ACTIVE MATRIX ORGANIC ELECTROLUMINESCENT DISPLAY DEVICE AND METHOD OF FABRICATING THE SAME

The present invention claims the benefit of Korean Patent Application No. 2002-0088417 filed in Korea on Dec. 31, 2002, which is hereby incorporated by reference.

BACKGROUND OF THE INVENTION

1. Field of the Invention

The present invention relates to a display device and a method of fabricating a display device, and more particularly, to an active matrix organic electroluminescent display device and method of fabricating an active matrix organic electroluminescent display device.

2. Discussion of the Related Art

An organic electroluminescent display device includes a cathode electrode to inject electrons, an anode electrode inject to holes, and an organic electroluminescent layer between the two electrodes. An organic electroluminescent diode has a multi-layer structure of organic thin films provided between the anode electrode and the cathode electrode. When a forward current is applied to the organic electroluminescent diode, electron-hole pairs (often referred to as excitons) combine in the organic electroluminescent layer as a result of a P-N junction between the anode electrode, which injects holes, and the cathode electrode, which injects electrons. The electron-hole pairs have a lower energy when combined than when they were separated. The resultant energy gap between the combined and separated electron-hole pairs is converted into light by an organic electroluminescent element. In other words, the organic electroluminescent layer emits the energy generated due to the recombination of electrons and holes in response to an applied current.

As a result of the above-described principles, the organic electroluminescent device does not need an additional light source as compared with a liquid crystal display device. Moreover, the electroluminescent device is thin, light weight, and is very energy efficient. As a result, the organic electroluminescent device has excellent advantages when displaying images, such as a low power consumption, high brightness, and a short response time. Because of these advantageous characteristics, the organic electroluminescent device is regarded as a promising candidate for various next-generation consumer electronic appliances, such as mobile communication devices, CNS (car navigation system), PDAs (personal digital assistances), camcorders, and palm PCs. Also, because the fabricating of such organic electroluminescent devices is a relatively simple process, an organic electroluminescent device is cheaper to produce than a liquid crystal display device.

Organic electroluminescent display devices may be provided in either a passive matrix type arrangement or an active matrix type arrangement. The passive matrix type has a simple structure and fabrication process, but has a high power consumption as compared to the active matrix type. Further, because the display size of passive matrix organic electroluminescent display devices is limited by its structure, the passive matrix type can not easily be adapted to a large sized device. Moreover, the aperture ratio of the passive matrix type decreases as the bus lines increases. In contrast, active matrix type organic electroluminescent display devices provide a higher display quality with higher luminosity as compared to the passive matrix type.

FIG. 1 is a schematic cross-sectional view illustrating an active matrix type organic electroluminescent display device according to a related art arrangement. As shown in FIG. 1, an organic electroluminescent display device 10 includes first and second substrates 12 and 28, which are attached to each other by a sealant 26. On the first substrate 12, a plurality of thin film transistors (TFTs) T and array portions 14 are formed. Each of the TFTs T corresponds to each pixel region P. A first electrode (i.e., an anode electrode) 16, an organic luminous layer 18 and a second electrode (i.e., a cathode electrode) 20 are sequentially formed on the array portion 14. At this point, the organic luminous layer 18 emits red (R), green (G) or blue (B) color in each pixel P. In particular, to show color images, organic color luminous patterns are disposed respectively in each pixel P.

As additionally shown in FIG. 1, the second substrate 28, which is attached to the first substrate 12 by the sealant 26, includes a moisture absorbent 22 on the rear surface thereof. The moisture absorbent 22 absorbs the moisture that may exist in the cell gap between the first and second substrates 12 and 28. When disposing the moisture absorbent 22 in the second substrate 28, a portion of the second substrate 28 is etched to form a dent. Thereafter, a powder-type moisture absorbent 22 is disposed into this dent, and then, a sealing tape 25 is put on the second substrate 28 to fix the powder-type moisture absorbent 22 into the dent.

FIG. 2 is an equivalent circuit diagram illustrating a pixel of the organic electroluminescent display device according to a related art arrangement. As shown in FIG. 2, a gate line GL is disposed in a transverse direction and a data line DL is disposed in a longitudinal direction substantially perpendicular to the gate line GL. A switching thin film transistor (switching TFT) $T_S$ is disposed in a crossing of the gate and data lines GL and DL and a driving thin film transistor (driving TFT) $T_D$ is disposed electrically connecting with the switching thin film transistor $T_S$. The driving TFT $T_D$ is electrically connected with an organic electroluminescent diode E. A storage capacitor $C_{ST}$ is disposed between a power line PL and a drain S6 of the switching TFT $T_S$. The storage capacitor $C_{ST}$ is also connected to a gate D2 of the driving TFT $T_D$. A source S4 of the switching TFT $T_S$ is connected to the data line DL, and a source D4 of the driving TFT $T_D$ is connected to the power line PL. The organic electroluminescent diode E comprises a first electrode, an organic luminous layer and a second electrode, as described in FIG. 1. The first electrode of the organic electroluminescent diode E electrically contacts with a drain D6 of the driving TFT $T_D$, the organic luminous layer is disposed on the first electrode, and the second electrode is disposed on the organic luminous layer.

Now, an operation of the organic electroluminescent display device will be briefly explained with reference to FIG. 2. When a gate signal is applied to a gate S2 of the switching TFT $T_S$ from the gate line GL, a data current signal flowing via the data line DL is converted into a voltage signal by the switching TFT $T_S$ to be applied to the gate D2 of the driving TFT $T_D$. Thereafter, the driving TFT $T_D$ is operated and determines a current level that flows through the organic electroluminescent diode E. As a result, the organic electroluminescent diode E can display a gray scale between black and white.

The voltage signal is also applied to the storage capacitor $C_{ST}$ such that a charge is stored in the storage capacitor $C_{ST}$. The charge stored in the storage capacitor $C_{ST}$ maintains the voltage of the voltage signal on the gate S2 of the driving TFT $T_D$. Thus, although the switching TFT $T_S$ is turned off, the current level flowing to the organic electroluminescent diode E remains constant until the next voltage signal is applied.

Meanwhile, the switching and driving TFTs $T_S$ and $T_D$ may include either of a polycrystalline silicon layer or an amorphous silicon layer. When the TFTs $T_S$ and $T_D$ include an amorphous silicon layer, fabrication of the TFTs $T_S$ and $T_D$ is more simple as compared to TFTs $T_S$ and $T_D$ that include a polycrystalline silicon layer.

FIG. 3 is a schematic plan view of an active matrix organic electroluminescent display device having a bottom emission type according to the related art. As shown in FIG. 3, the active matrix organic light emitting diode device includes, for example, inverted staggered type thin film transistors.

A gate line 36 crosses a data line 49 and a power line 62, which are spaced apart from each other. A pixel region is defined between the gate line 36 and the spaced apart data and power supply lines 49 and 62. A switching thin film transistor (TFT) $T_S$ is disposed adjacent to where the gate line 36 and the data line 49 cross each other. A driving thin film transistor (TFT) $T_D$ is disposed next to the power line 62 and in the pixel region. The driving TFT $T_D$ has a larger size than the switching TFT $T_S$, and therefore, the driving TFT $T_D$ occupies a relatively large space of the pixel region.

The switching TFT $T_S$ includes a switching gate electrode 32 extending from the gate line 36, a switching source electrode 48 extending from the data line 49, a switching drain electrode 50 spaced apart from the switching source electrode 48, and a switching active layer 56a above the switching gate electrode 32. The switching active layer 56a is formed of amorphous silicon and has an island shape.

The driving TFT $T_D$ is connected to the switching TFT $T_S$ and the power line 62. The driving TFT $T_D$ includes a driving gate electrode 34, a driving source electrode 52, a driving drain electrode 54 and a driving active layer 58a. The driving gate electrode 34 is connected with the switching drain electrode 50 and elongates along side the power line 62. The driving active layer 58a is formed of amorphous silicon and has a long island shape. Additionally, the driving active layer 58a also elongates along side the power line 62 while also overlapping the driving gate electrode 34. The driving source and drain electrodes 52 and 54 overlap side portions of the driving gate electrode 34. The driving active layer 58a having an island shape is disposed above the driving gate electrode 34 between the driving source and drain electrodes 52 and 54.

As also shown in FIG. 3, the power line 62 has a protrusion extending to the driving source electrode 50 and electrically communicates with the driving source electrode 50 through the protrusion. A first electrode 66 of the organic electroluminescent diode is disposed in the pixel region and connected with the driving drain electrode 54.

The driving thin film transistor $T_D$ needs to have an ability to operate and drive the organic electroluminescent diode. Thus, a channel of the driving thin film transistor $T_D$ should have a large channel width W and a short channel length L such that the ratio of width W and length L should be large enough. Thus, the driving thin film transistor $T_D$ can supply sufficient current to the organic electroluminescent diode to operate and driving the organic electroluminescent diode.

FIGS. 4 and 5 are cross sectional views taken along lines IV-IV and V-V of FIG. 3 illustrating the switching thin film transistor and the driving thin film transistor, respectively.

In FIGS. 4 and 5, the switching gate electrode 32 and the driving gate electrode 34 is formed on a substrate 30. Although not shown in FIGS. 4 and 5, but shown in FIG. 3, the gate line 36 is also formed on the substrate 30. As described before, the driving gate electrode 34 is larger than the switching gate electrode 32 and occupies a large portion of the pixel region. A gate insulating layer 38 is formed on the substrate to cover the driving and switching gate electrodes 32 and 34 and the gate line 36. The gate insulating layer 38 has a contact hole that exposes a bottom end of the driving gate electrode 34. A switching semiconductor layer 56 and a driving semiconductor layer 58 are formed on the gate insulating layer 38, respectively, above the switching gate electrode 32 and above the driving gate electrode 34. The switching semiconductor layer 56 comprises a switching active layer 56a of pure amorphous silicon and a switching ohmic contact layer 56b of doped amorphous silicon. The driving semiconductor layer 58 is comprises a driving active layer 58a of pure amorphous silicon and a driving ohmic contact layer 58b of doped amorphous silicon. As shown in FIG. 3, the driving semiconductor layer 58 is larger than the switching semiconductor layer 56. The switching source and drain electrodes 48 an 50 are formed spaced apart from each other and contact the switching ohmic contact layer 56b, and the driving source and drain electrodes 52 and 54 are formed spaced apart from each other in contact with the diving ohmic contact layer 58b. The switching drain electrode 50 also electrically contacts the driving gate electrode 34. The data line 49 is also formed on the gate insulating layer 38 and disposed perpendicularly crossing the gate line 36, as shown in FIGS. 3 and 4. Therefore, the switching thin film transistor $T_S$ and the driving thin film transistor $T_D$ are complete.

A first passivation layer 60 is formed over an entire of the substrate 30 to cover the switching thin film transistor $T_S$ and the driving thin film transistor $T_D$. The first passivation layer 60 has a contact hole that exposes the driving source electrode 52. Then, the power line 62 is formed on the first passivation layer 60 and contacts the driving source electrode 52 through the contact hole, as shown in FIG. 5. The power line 62 is spaced apart from the data line 49 and perpendicularly crosses the gate line 36, as shown in FIG. 3, thereby defining the pixel region with the gate and data lines 36 and 49. A second passivation layer 64 is formed over an entire of the substrate 30 to cover the power line 62. The first and second passivation layers 60 and 64 have a contact hole that exposes a portion of the driving source electrode 54 through the contact hole. The first electrode 66 of the organic electroluminescent diode is formed on the second passivation layer 64 and electrically contacts the driving drain electrode 54. The first electrode 66 is disposed in the pixel region as shown in FIG. 3.

In the related art shown in FIGS. 3-5, the driving active layer 58a has a wide channel width and a short channel length, so that the driving thin film transistor $T_D$ occupies a large amount of the pixel region. Therefore, an aperture ratio the bottom emission type organic electroluminescent display device is decreased. Further, since a large amount of current flows through the driving thin film transistor $T_D$, current stress may be caused in the driving thin film transistor $T_D$, thereby damaging the driving thin film transistor $T_D$. Especially, when the DC bias is continuously applied to the driving thin film transistor $T_D$, the electrical properties of the driving thin film transistors $T_D$ deteriorates and eventually malfunctions. Accordingly, the active matrix organic electroluminescent display device having the above-mentioned driving thin film transistor may show an residual image phenomenon, thereby causing bad display quality. Additionally, when the driving thin film transistor is deteriorated and malfunctioned by the electrical stress, a dot defect occurs in the pixel.

SUMMARY OF THE INVENTION

Accordingly, the present invention is directed to an organic electroluminescent device (OELD) device and a method of fabricating an OELD device that substantially obviates one or more of the problems due to limitations and disadvantages of the related art.

An object of the present invention is to provide an active matrix OELD device having a driving thin film transistor arrangement in a pixel with decreased electrical current stress.

Another object of the present invention is to provide OELD device having improved image resolution and high aperture ratio.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent display device comprising a substrate; a gate line on the substrate; a data line crossing the gate line over the substrate; a switching thin film transistor near the crossing of the gate line and data line; a driving thin film transistor system including a plurality of sub-TFTs connected in parallel to the switching thin film transistor via a gate base; a power line crossing the gate line over the substrate and electrically connected with the plurality of sub-TFTs; a first electrode over the driving thin film transistor system in contact with the plurality of sub-TFTs; an organic electroluminescent layer on the first electrode; and a second electrode of transparent material on the organic electroluminescent layer.

In another aspect, a method of fabricating an organic electroluminescent display device including pixels each having a pixel region, a switching region and a driving region, comprises forming a first metal layer on a substrate; patterning the first metal layer to form a gate line, a switching gate electrode in the switching region, a gate base in the pixel region, and plural driving gate electrodes in the driving region; forming a first insulating layer on the substrate to cover the gate line, the switching gate electrode, the gate base and the plural gate electrodes; forming a switching active layer on the first insulating layer over the switching gate electrode and plural driving active layers on the first insulating layer over the plural driving gate electrodes; forming a second metal layer over the switching and driving active layers; patterning the second metal layer to form a switching source, a switching drain electrode, plural driving source electrodes, and plural driving drain electrodes, thereby forming a switching thin film transistor and a driving thin film transistor system, wherein the driving thin film transistor system includes a plurality of sub-TFTs each having a corresponding driving gate electrode, a corresponding driving active layer, a corresponding driving source electrode, and a corresponding driving drain electrode; forming a second insulating layer over the switching source and drain electrodes and the plural driving drain electrodes, wherein the second insulating layer has source contact holes the expose portions of the plural driving source electrodes; forming a power line on the second insulating layer, the power line defining the pixel region with the gate and data lines and electrically communicating with the plural driving source electrodes through the source contact holes; forming a third insulating layer on the second insulating layer on the second insulating layer to cover the power line, the third insulating layer having drain contact holes exposing the plural driving drain electrodes; forming a first electrode on the third insulation layer within the pixel region, the first electrode contacting the plural driving drain electrodes via the drain contact holes; forming an organic electroluminescent layer on the first electrode; and forming a second electrode of transparent material on the organic electroluminescent layer.

In another aspect, an organic electroluminescent display device comprises a first substrate; a gate line on the first substrate; a data line crossing the gate line over the first substrate; a switching thin film transistor near the crossing of the gate line and data line; a driving thin film transistor system including a plurality of sub-TFTs connected in parallel to the switching thin film transistor via a gate base; a power line crossing the gate line over the first substrate and electrically connected with the plurality of sub-TFTs; an organic electroluminescent diode on a second substrate; and a connection pattern between the first and second substrates, the connection pattern electrically connecting the driving thin film transistor system to the organic electroluminescent diode.

In another aspect, a method of fabricating an organic electroluminescent display device including pixels each having a pixel region, a switching region and a driving region, comprises forming a first metal layer on a first substrate; patterning the first metal layer to form a gate line, a switching gate electrode in the switching region, a gate base in the pixel region, and plural driving gate electrodes in the driving region; forming a first insulating layer on the first substrate to cover the gate line, the switching gate electrode, the gate base and the plural gate electrodes; forming a switching active layer on the first insulating layer over the switching gate electrode and plural driving active layers on the first insulating layer over the plural driving gate electrodes; forming a second metal layer over the switching and driving active layers; patterning the second metal layer to form a switching source, a switching drain electrode, plural driving source electrodes, and plural driving drain electrodes, thereby forming a switching thin film transistor and a driving thin film transistor system, wherein the driving thin film transistor system includes a plurality of sub-TFTs each having a corresponding driving gate electrode, a corresponding driving active layer, a corresponding driving source electrode, and a corresponding driving drain electrode; forming a second insulating layer over the switching source and drain electrodes and the plural driving drain electrodes, wherein the second insulating layer has source contact holes the expose portions of the plural driving source electrodes; forming a power line on the second insulating layer, the power line defining the pixel region with the gate and data lines and electrically communicating with the plural driving source electrodes through the source contact holes; forming a third insulating layer on the second insulating layer on the second insulating layer to cover the power line, the third insulating layer having drain contact holes exposing the plural driving drain electrodes; forming a connection pattern on the third insulating layer within the pixel region, the connection pattern contacting the plural driving drain electrodes via the drain contact holes; and forming an organic electroluminescent diode on a second substrate, the connection pattern electrically connecting the driving thin film transistor system to the organic electroluminescent diode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, similar reference numbers will be used throughout the drawings to refer to the same or like parts.

Figure 1:
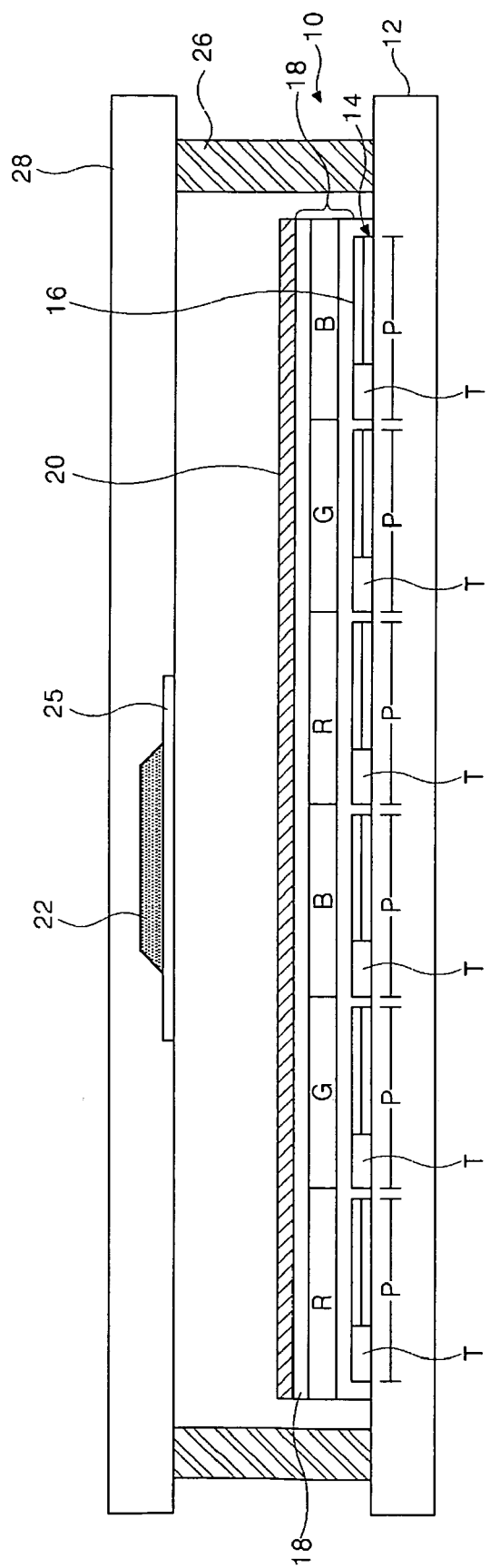
FIG. 1 is a schematic cross-sectional view illustrating an active matrix type organic electroluminescent display device according to a related art arrangement.
Figure 2:
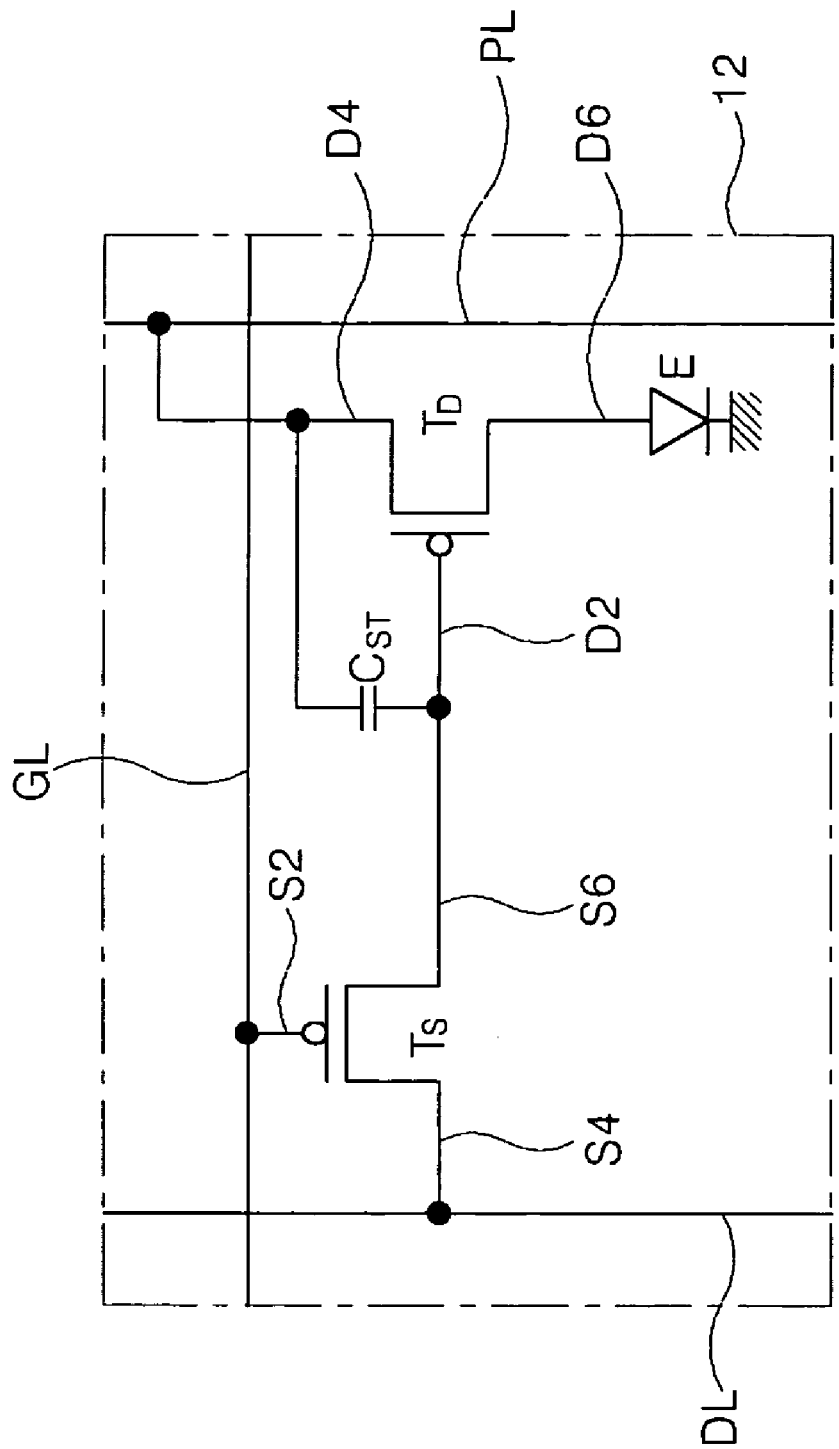
FIG. 2 is an equivalent circuit diagram illustrating a pixel of the organic electroluminescent display device according to a related art arrangement.
Figure 3:
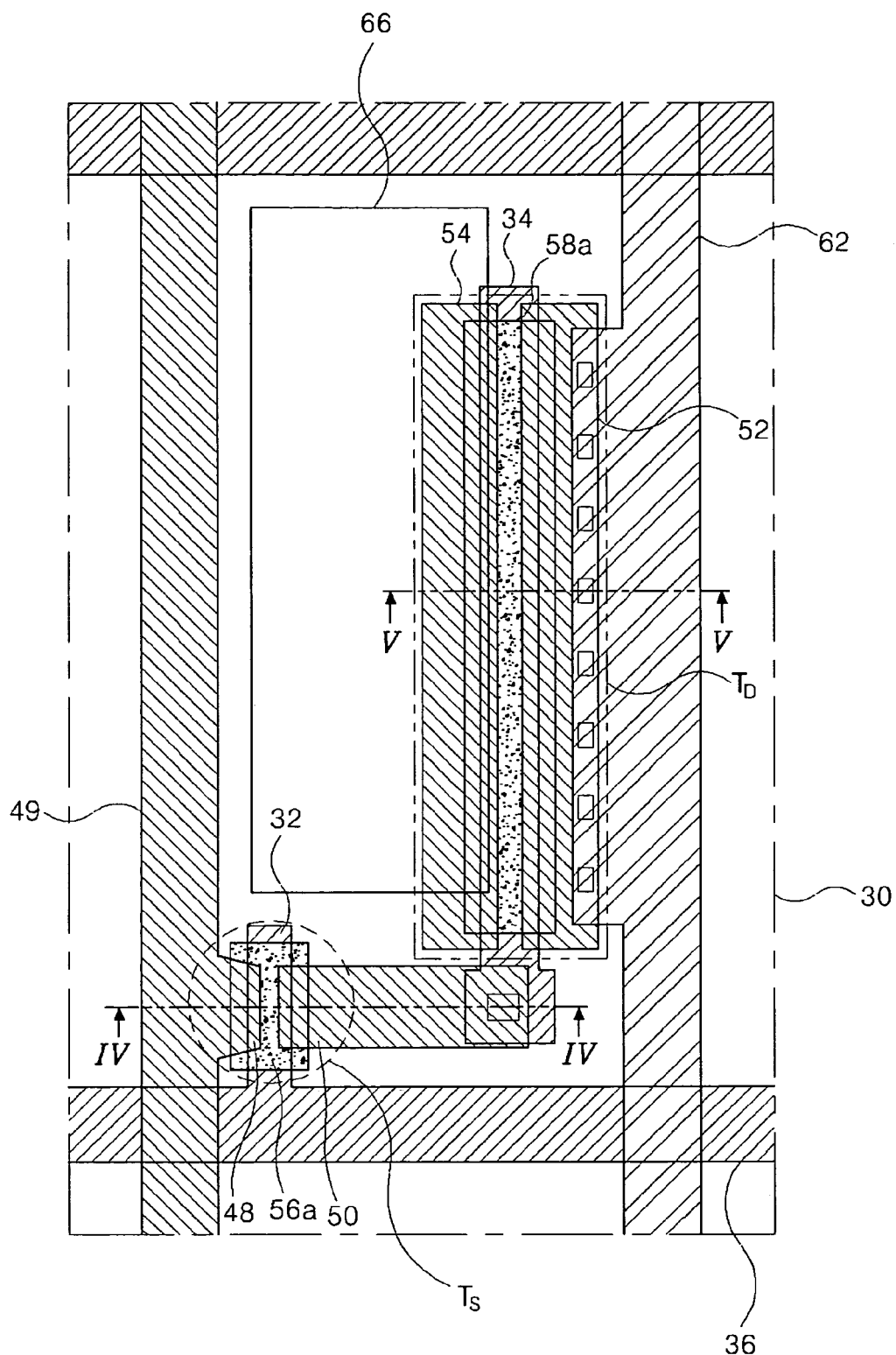
FIG. 3 is a schematic plan view of an active matrix organic electroluminescent display device having a bottom emission type according to the related art.
Figure 4:
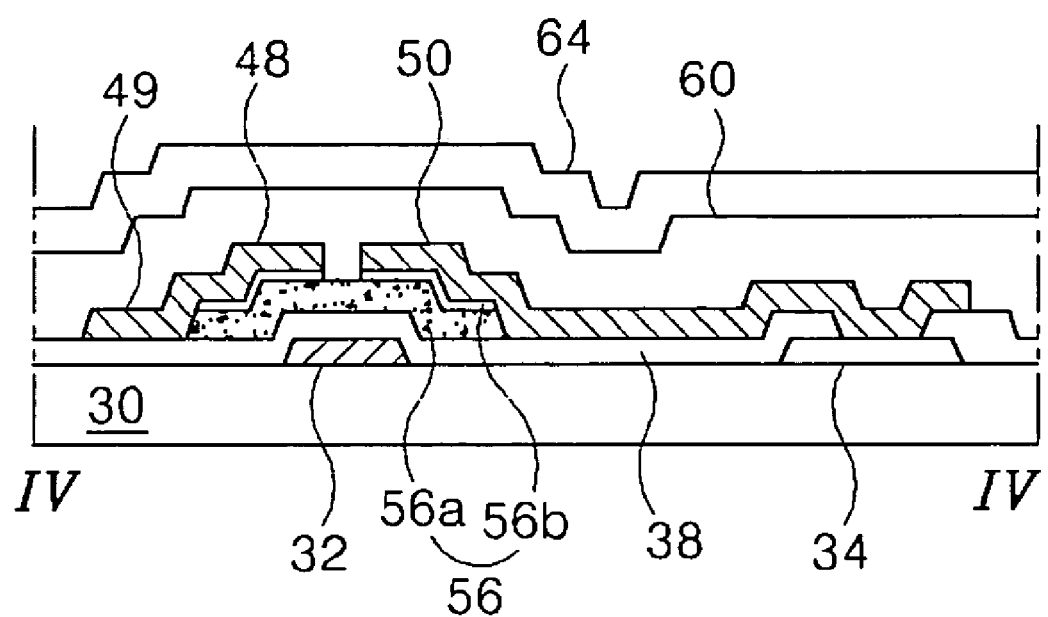
FIGS. 4 and 5 are cross sectional views taken along lines IV-IV and V-V of FIG. 3 illustrating the switching thin film transistor and the driving thin film transistor, respectively.
Figure 5:
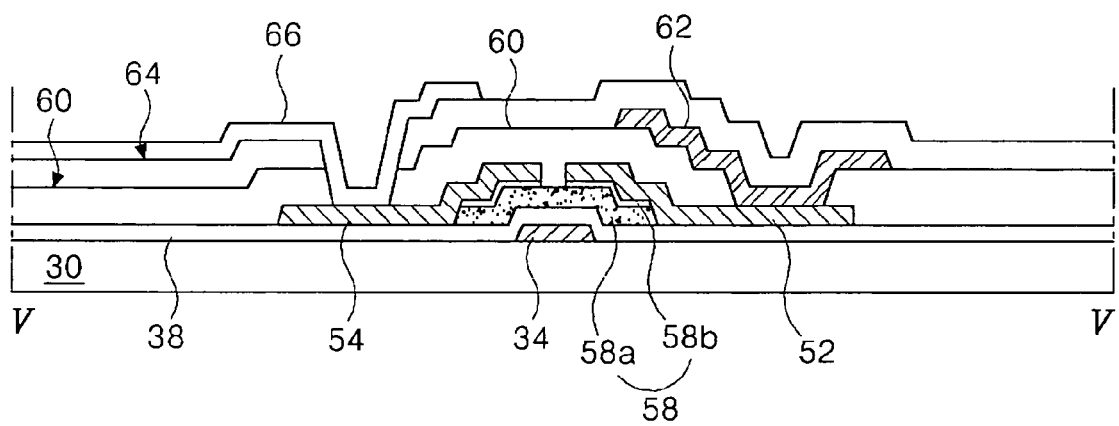
Figure 6:
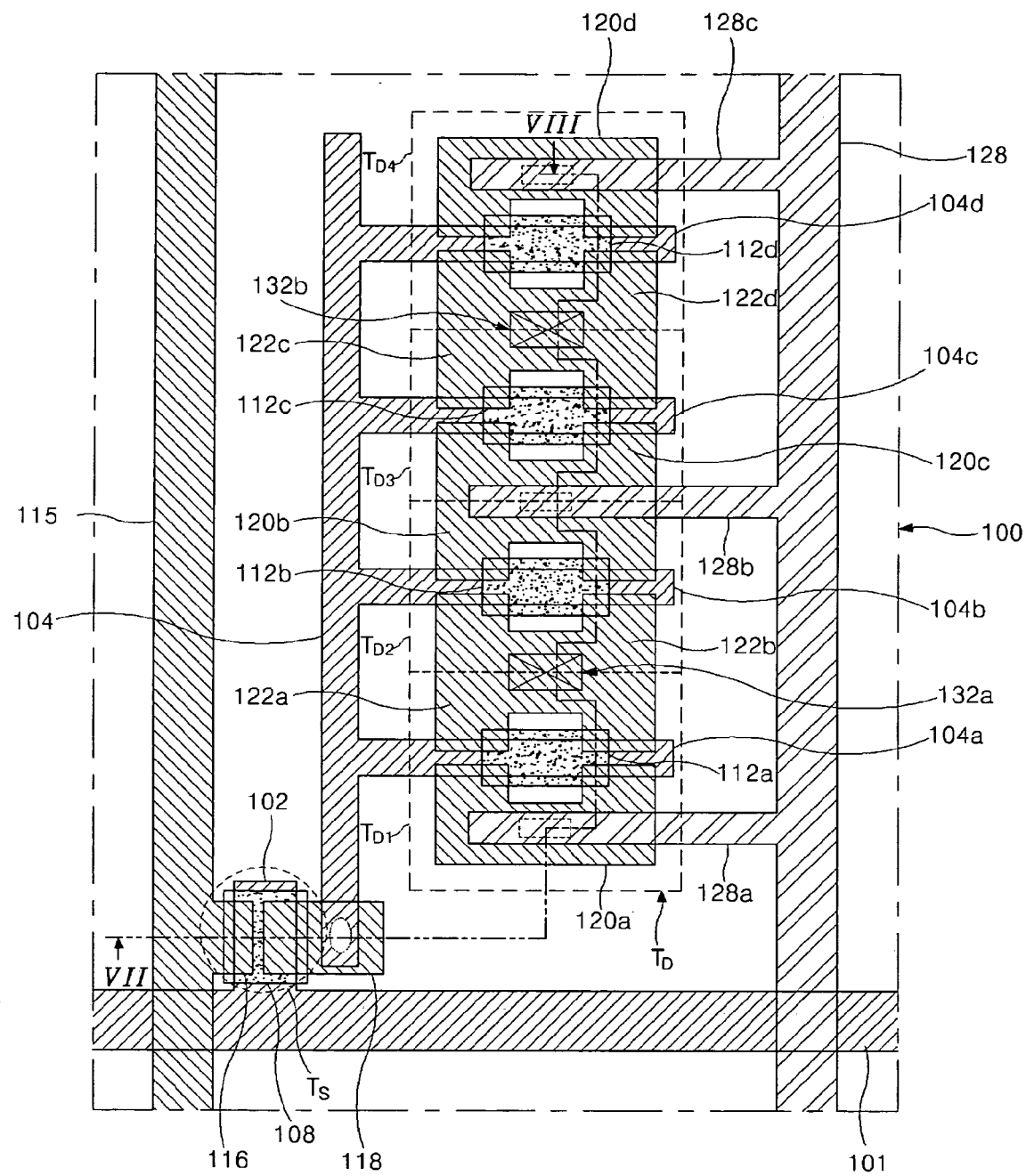
FIG. 6 is a schematic plan view of an active matrix organic electroluminescent display device according to the present invention.

FIG. 6 is a schematic plan view of a pixel of an exemplary active matrix organic electroluminescent display device according to the present invention. The active matrix organic electroluminescent display device of FIG. 6 is a top emission type unlike the related art of FIG. 3. A gate line 101 crosses a data line 115 and a power line 128, which are spaced apart from each other. A pixel region is defined between the gate line 101 and the spaced apart data and power supply lines 115 and 128. A switching thin film transistor (TFT) $T_S$ is disposed adjacent to where the gate line 101 and the data line 115 cross each other. A driving thin film transistor (TFT) $T_D$ is disposed in the pixel region between the data line 115 and the power line 128. The driving TFT $T_D$ in this arrangement is a transistor system that comprises a plurality of sub-TFT, for example, first to fourth sub-TFTs.

The switching TFT $T_S$ includes a switching gate electrode 102 extending from the gate line 101, a switching source electrode 116 extending from the data line 115, a switching drain electrode 118 spaced apart from the switching source electrode 116, and a switching active layer 108 above the switching gate electrode 102. The switching active layer 108 is formed of amorphous silicon and has an island shape. The switching drain electrode 118 has a connection with a driving gate base 104 that extends parallel with the data line 115 and used for connecting gate electrodes of the plural sub-TFTs of the driving TFT $T_D$.

The driving TFT $T_D$ has, for example, first to fourth sub-TFTs $T_{D1}$, $T_{D2}$, $T_{D3}$ and $T_{D4}$, which are connected in parallel with each other. The first to fourth sub-TFTs $T_{D1}$, $T_{D2}$, $T_{D3}$ and $T_{D4}$ have gate electrodes 104a, 104b, 104c and 104d, respectively, which extend perpendicular from the driving gate base 104. The first to fourth sub-TFTs $T_{D1}$, $T_{D2}$, $T_{D3}$ and $T_{D4}$ have active layer 112a, 112b, 112c and 112d, respectively, each of which is disposed above each of the gate electrodes 104a, 104b, 104c and 104d. Additionally, the first to fourth sub-TFTs $T_{D1}$, $T_{D2}$, $T_{D3}$ and $T_{D4}$ include source electrodes 120a, 120b, 120c and 120d and drain electrodes 122a, 122b, 122c and 122d. The first source electrode 120a is spaced apart from the first drain electrode 122a across the gate electrode 104a, the second source electrode 120b to the second drain electrode 122b across the second gate electrode 104b, the third source electrode 120c to the third drain electrode 122c across the third gate electrode 104c, and the fourth source electrode 120d to the drain electrode 122d across the fourth gate electrode 104d. The first drain electrode 122a and the second drain electrode 122b are formed as one united body, the second source electrode 120b and the third source electrode 120c are formed as one united body, and the third drain electrode 122c and the fourth drain electrode 122d are formed as one united body. First to third power electrodes 128a, 128b and 128c extend from the power line 128 over the driving TFT $T_D$. The first power electrode 128a overlaps and contacts the first source electrode 120a, the second power electrode 128b overlaps and contacts the one united body of the second and third source electrodes 120b and 120c, and the third power electrode 128c overlaps and contacts the fourth source electrode 120d. First and second drain contact holes 132a and 132b are formed in the middle of the united body of the first and second drain electrodes 122a and 122b and in the middle of the united body of the third and fourth drain electrodes 122c and 122d. In this manner, the first and fourth TFTs $T_{D1}$, $T_{D2}$, $T_{D3}$ and $T_{D4}$, which are parallel connected, are complete. Although FIG. 6 shows the four sub-TFTs, the number of sub-TFTs can increase (or decrease) using the above-mentioned configuration. Meanwhile, although not shown in FIG. 6, a first electrode of the organic electroluminescent diode electrically communicates with the drain electrodes 122a, 122b, 122c and 122d by contacting them through the first and second drain contact hole 132a and 132b.

In the structure and configuration described with reference to FIG. 6, the driving TFT $T_D$ includes the parallel-connected sub-TFTs $T_{D1}$, $T_{D2}$, $T_{D3}$ and $T_{D4}$, so that the driving TFT $T_D$ alleviates and distributes the overflowing electrical current stress. Furthermore, since the plural sub-TFTs exist and are used for driving the organic electroluminescent diode, the driving TFT $T_D$ can safely operate even when one of the sub-TFTs is damaged.

FIGS. 7A-7E are cross sectional views taken along a line VII-VII of FIG. 6 and illustrate an exemplary fabrication process for the active matrix organic electroluminescent display device according to one exemplary arrangement of the present invention.

Figure 7A:
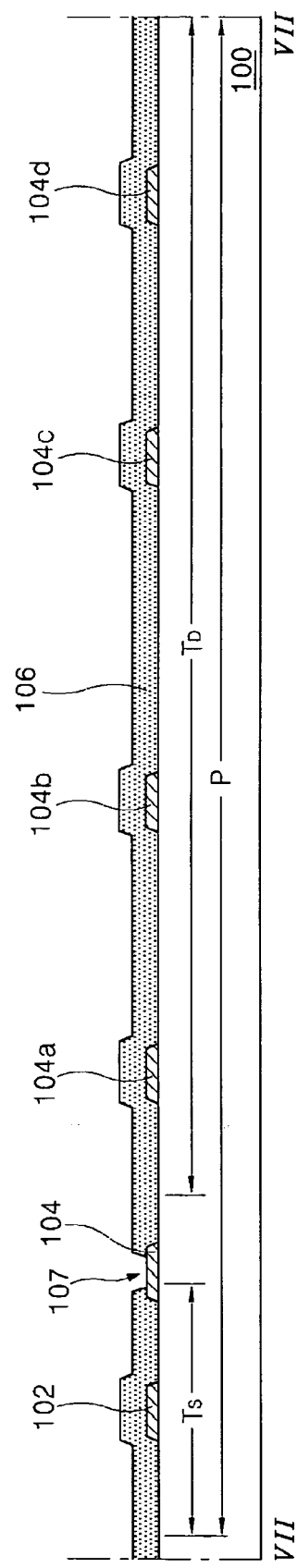
FIGS. 7A-7E are cross sectional views taken along a line VII-VII of FIG. 6 and illustrate an exemplary fabrication process for the active matrix organic electroluminescent display device according to one exemplary arrangement of the present invention.

In FIG. 7A, a substrate 100 having a switching region $T_S$, a driving region $T_D$ and a pixel region P is provided. Thereafter, a first metal layer is deposited on the substrate 100. The first metal layer may be formed of aluminum (Al), tungsten (W), copper (Cu), molybdenum (Mo), titanium (Ti), aluminum neodymium (AlNd) or alloys thereof. The first metal layer is then patterned to form a gate line (reference 101 of FIG. 6), a switching gate electrode 102, a gate base 104 and first to fourth driving gate electrodes 104a-104d. The switching gate electrode 102 extends from the gate line and is disposed in the switching region $T_S$, while the first to fourth driving gate electrodes 104a-104d extend from the gate base 104 and are disposed in the driving region $T_D$. The gate base 104 is elongated perpendicular to the gate line and disposed in the pixel region, as shown in FIG. 6. Additionally, the gate base 104 connects the first and fourth driving gate electrodes 104a-104d at the ends thereof.

After patterning the first metal layer, a gate insulating layer 106 is formed on the entire resultant surface of the substrate 100 to cover the gate line, the switching gate electrode 102, the gate base 104 and the first to fourth driving gate electrodes 104a-104d. The gate insulating layer 106 is preferably an inorganic material, for example, silicon nitride ($SiN_x$) or silicon oxide ($SiO_2$). Then, the gate insulating layer 106 is patterned to have a gate contact hole 107 that exposes one end of the gate base 104.

Figure 7B:
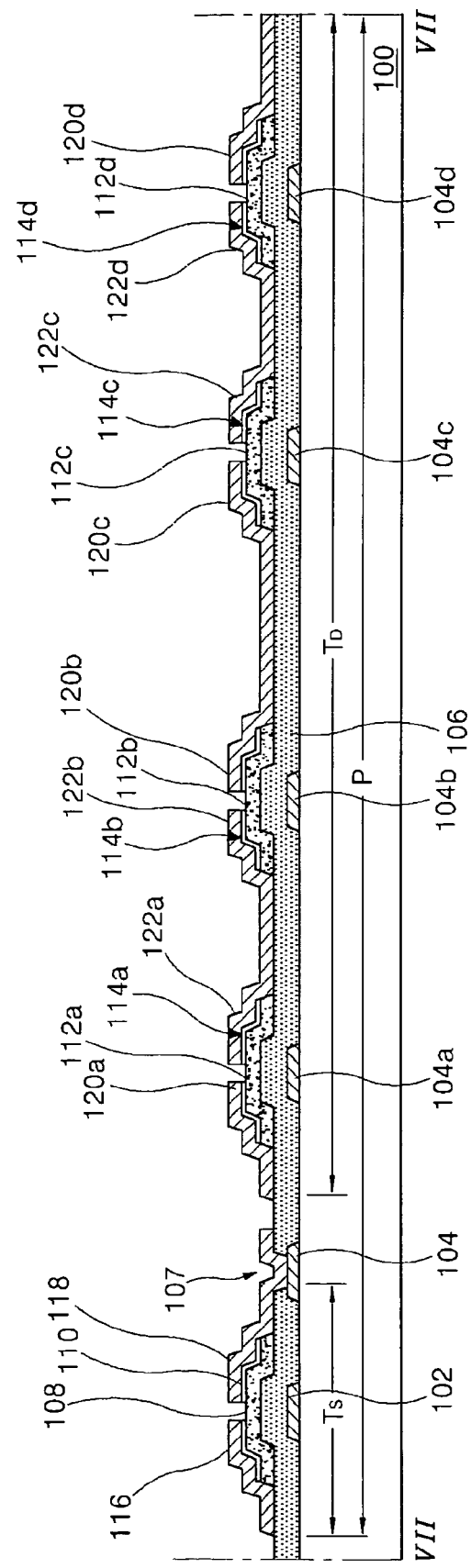

In FIG. 7B, a pure amorphous silicon (a-Si:H) layer and a doped amorphous ($n^+$a-Si:H) silicon layer are sequentially formed on the gate insulating layer 106 and then patterned, thereby forming active layers 108 and 112a-112d and ohmic contact layers 110 and 114a-114d on the gate insulating layer 106. Of course, other suitable materials may be used. However, the active layers are generally the pure amorphous silicon, and include a switching active layer 108 and first to fourth driving active layers 112a-112d. The ohmic contact layers are generally the doped amorphous silicon and include a driving ohmic contact layer 110 and first to fourth driving ohmic contact layers 114a-114d. The switching active and ohmic contact layers 108 and 110 correspond to the switching gate electrode 102, the first driving active and ohmic contact layers 112a and 114a to the first driving gate electrode 104a, the second driving active and ohmic contact layers 112b and 114b to the second driving gate electrode 104b, the third driving active and ohmic contact layers 112c and 114c to the third driving gate electrode 104c, and the fourth driving active and ohmic contact layers 112d and 114d to the fourth driving gate electrode 104d.

Thereafter, a second metal layer is formed over an entire resultant surface of the gate insulating layer 106 to cover the active layers 108 and 112a-112d and the ohmic contact layers 110 and 114a-114d, and then patterned to form source electrodes 116 and 120a-120d and drain electrodes 118 and 122a-122d. Each of the source electrodes 116 and 120a-120d is spaced apart from the corresponding drain electrode. The switching source and drain electrodes 116 and 118 are formed on the switching ohmic contact layer 110, and the switching drain electrode 118 contacts the gate base 104 through the gate contact hole 107. The first to fourth driving source and drain electrodes 120a-120d and 122a-122d are formed on the first to fourth driving ohmic contact layers 114a-114d, respectively. In the exemplary arrangement of present invention as illustrated here, the first driving drain electrode 122a has one united body with the second driving drain electrode 122b. The second driving source electrode 120b has a one united body with the third driving source electrode 120c. The third driving drain electrode 122c has a one united body with the fourth driving drain electrode 122d. Although only four driving source and drain electrodes are shown in FIG. 7B, more (or less) than four are possible in this manner. Additionally, each of the driving source and drain electrodes can be formed separately.

After forming the source and drain electrodes described above, portions of the ohmic contact layers 110 and 114a-114d exposed between the source and drain electrodes are removed, thereby forming a channel on the underlying active layers 108 and 112a-112d. Accordingly, a driving TFT $T_D$ having the parallel-connected sub-TFTs is complete, and a switching TFT $T_S$ has an electrical connection with the driving TFT $T_D$ via the gate base 104 is complete.

Figure 7C:
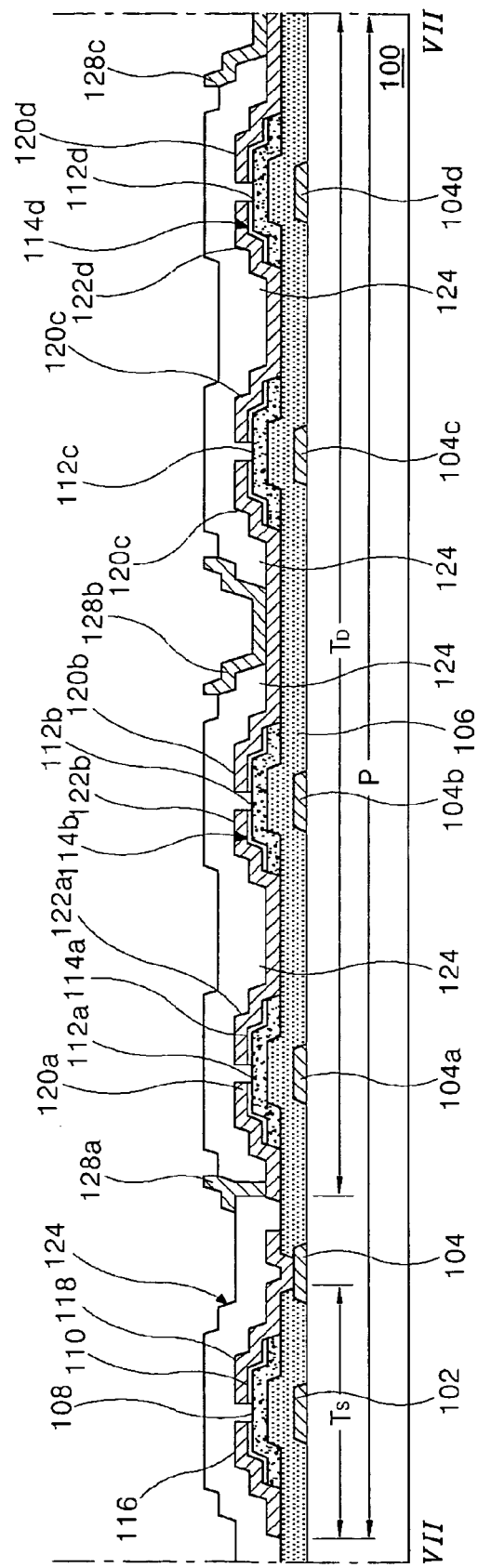

Now in FIG. 7C, a first passivation layer 124 is formed over an entire surface of the substrate 100 to cover the source electrodes 116 and 120a-120d and the drain electrodes 118 and 122a-122d. Then, the first passivation layer 124 is patterned to expose portions of the driving source electrodes 120a-120d. A first source contact hole exposes the first driving source electrode 120a, a second source contact hole exposes a middle portion between the second driving source electrode 120b and the third driving source electrode 120c. After that, a third metal layer is formed over an entire of the first passivation layer and then patterned to form a power line (reference 128 of FIG. 6) as well as first and third power electrodes 128a-128c. As shown in FIG. 6, the power electrodes 128a-128c extend from the power line over the driving source electrodes 120a-120d. The first power electrode 128a contacts the first driving source electrode 120a through the first source contact hole, and the second power electrode 128b contacts the second and third driving source electrodes 120b and 120c through the second source contact hole. Also, the third power electrode 128c contacts the fourth driving source electrode 120d through the third source contact hole.

Figure 7D:
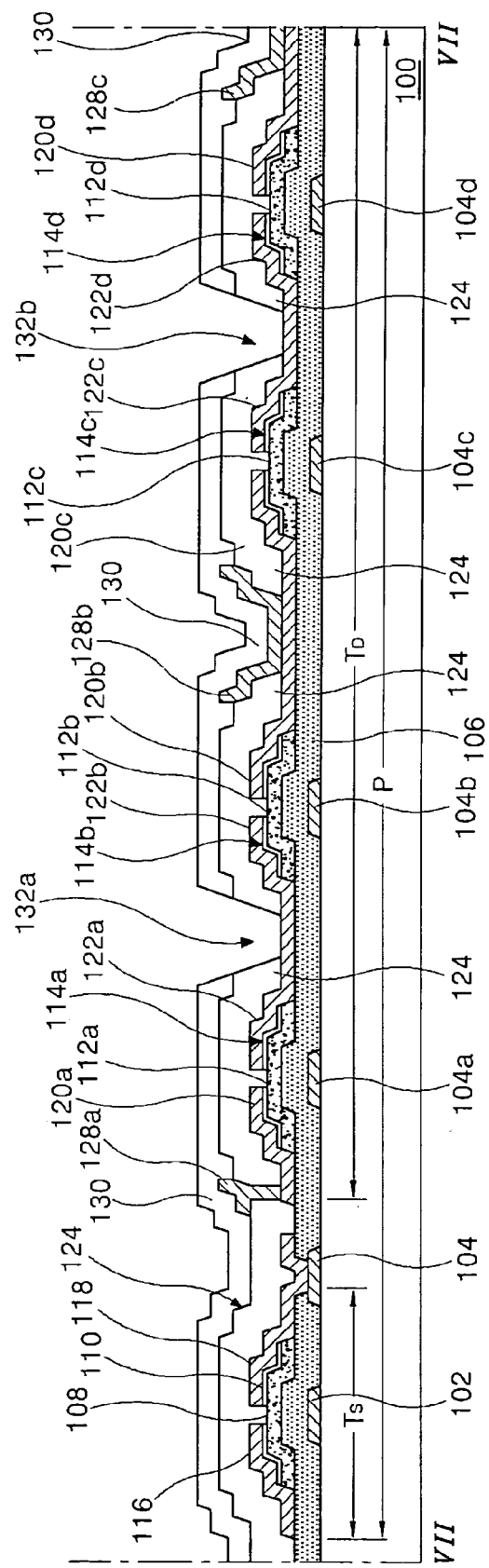

In FIG. 7D, a second passivation layer 130 is formed over the first passivation layer 124 to cover the power line 128 and the power electrode 128a-128d. Then, the first and second passivation layers 124 and 130 are simultaneously patterned to form first and second drain contact holes 132a and 132b. The first drain contact hole 132a exposes a middle portion between the first and second driving drain electrodes 122a and 122b, and the second drain contact hole 132b exposes a middle portion between the third and fourth driving drain electrodes 122c and 122d. The second passivation layer 130 may be an organic material, such as benzocyclobutene (BCB) or acrylic resin. After these steps, the substrate shown in FIG. 7D having the thin film transistors for use in an organic electroluminescent display device is fabricated.

Figure 7E:
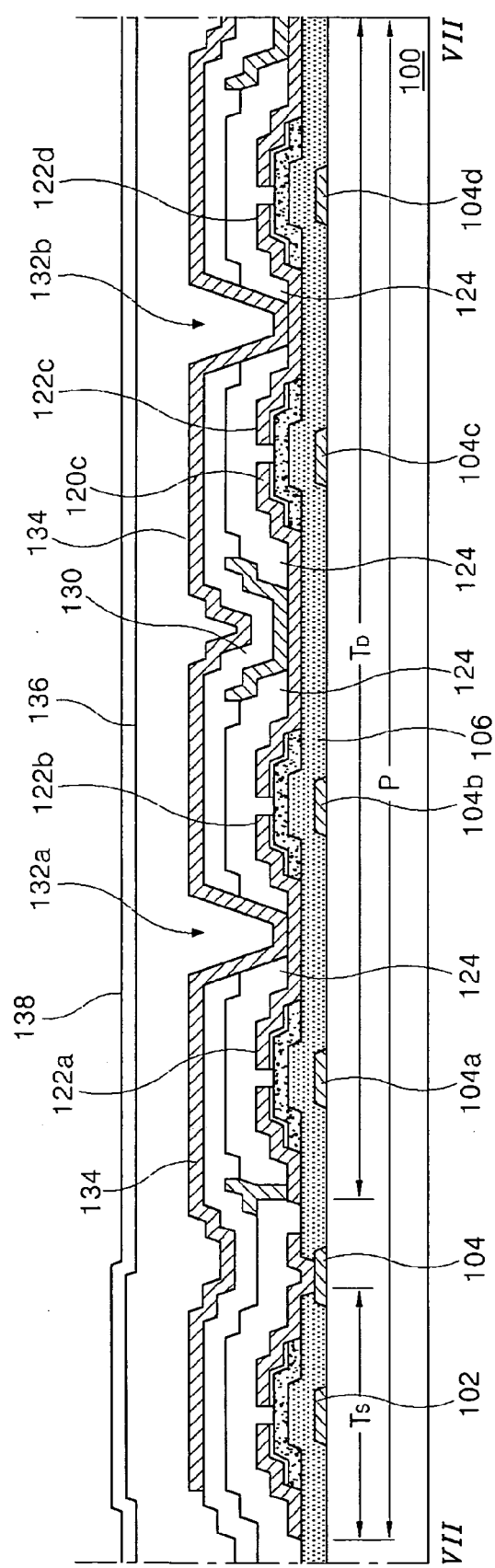

FIG. 7E shows a step of forming an organic electroluminescent diode on the substrate having the thin film transistors. A conductive material having a low work function, such as aluminum (Al), magnesium (Mg), calcium (Ca) or lithium-fluorine/aluminum(LiF/Al), is deposited all over the substrate 100, thereby forming a first electrode 134 (i.e., a cathode electrode). The first electrode 134 is formed to be disposed in the pixel region P contacting the first to fourth driving drain electrodes 122a-122d through the first and second drain contact holes 132a and 132b. Thereafter, an organic electroluminescent layer 136 is formed on the first electrode 134. Although the organic electroluminescent layer 136 is depicted as a single layer in FIG. 7E, it can be multiple-layered. If organic electroluminescent layer 136 is a multiple layer, the organic electroluminescent layer 136 can include an electron injection layer, an emission layer and a hole injection layer in a sequential order from the first electrode 134. A second electrode 138 having a high work function, such as indium-tin-oxide (ITO), is formed on the organic electroluminescent layer 136. The second electrode 138 is transparent and acts as a anode electrode, so that the organic electroluminescent display device shown in FIG. 7E becomes a top emission type. Since the organic electroluminescent display device fabricated through FIGS. 7A-7E is the top emission type, light is emitted along the direction opposite to the substrate where the lines and TFTs are disposed, thereby increasing the display area and simplifying design the TFTs.

Figure 8:
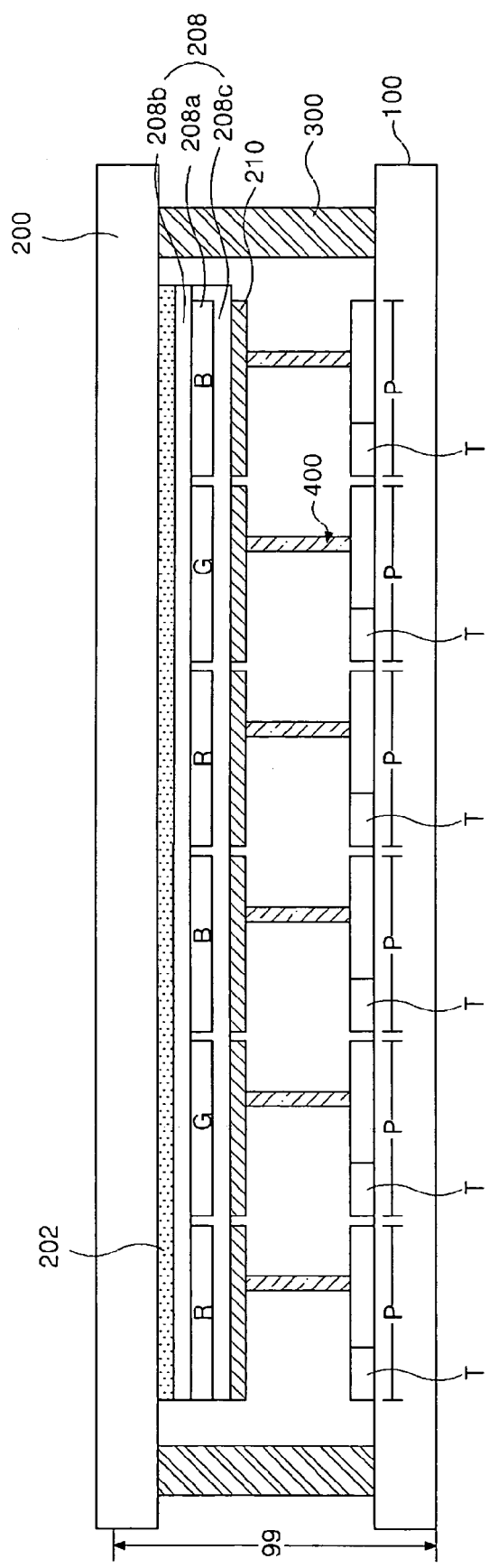
FIG. 8 is a cross sectional view of a dual panel type organic electroluminescent display device according to another exemplary arrangement of the present invention.

FIG. 8 is a cross sectional view of a dual panel type organic electroluminescent display device according to another exemplary arrangement of the present invention. Here, the organic electroluminescent display device 99 has two substrates on which the thin film transistors and the organic electroluminescent diode are respectively disposed.

In FIG. 8, first and second spaced apart substrates 100 and 200, which have inner surfaces facing each other, have a plurality of pixel regions P. An array layer including switching and driving thin film transistors (TFTs) T in each pixel region is formed on an inner surface of the first substrate 100. A connection pattern 400 connected to the TFT T is formed on the array layer in each pixel region. The connection pattern 400 can be made of a conductive material or multiple layers, including an insulating material with one or more layers of conductive material, having sufficient thickness for connection. An additional connection electrode can be used for connecting the connection pattern 400 and the TFT T. The TFT T includes the inventive driving TFT described with reference to FIGS. 6 and 7A-7E. The connection pattern 400 is connected to the driving drain electrodes of the driving TFT having the plural sub-TFTs.

A first electrode 202 is formed on an inner surface of the second substrate 200. An organic electroluminescent (EL) layer 208 including red (R), green (G) and blue (B) organic emission layers 208a alternately disposed in each pixel region is formed on the first electrode 202. A second electrode 210 is formed on the organic EL layer 208 in each pixel region P. The organic EL layer 208 can be formed of a single layer or of multiple layers. In the case of multiple layers, the organic EL layer 208 may include a first carrier-transporting layer 208b on the first electrode 202, one each of red (R), green (G) and blue (B) emission layers 208a on the first carrier-transporting layer 208b, and a second carrier-transporting layer 208c on each of the emission layers 208a. For example, when the first and second electrodes 202 and 210 are respectively an anode and a cathode, the first carrier-transporting layer 208b corresponds to a hole-injecting layer and a hole-transporting layer, and the second carrier-transporting layer 208c corresponds to an electron-transporting layer and an electron-injecting layer. The first and second electrodes, 202 and 210, and the organic EL layer 208 interposed therebetween define an organic EL diode.

The first and second substrates 100 and 200 are attached with a sealant 300 at a peripheral portion thereof. A top surface of the connection pattern 400 contacts bottom surface of the second electrode 210, so that a current of the driving TFT T$_D$ is flowing into the second electrode 210 through the connection pattern 400. An organic electroluminescent display device as described with reference to FIG. 8 is a dual panel type where an array layer and an organic EL diode are formed on respective substrates and where a connection pattern 400 electrically connects the array layer to the organic EL diode, which is an organic electroluminescent diode. The TFTs T of FIG. 8 can be fabricated through the process described in FIGS. 7A-7E, and various modifications and variations can be made in the structure of the TFTs and the connecting method of the array layer and the organic EL diode. Moreover, since the organic electroluminescent display device of FIG. 8 is a top emission type, the thin film transistors T can be easily designed to obtain a high resolution and high aperture ratio.

Accordingly, the present invention has a number of advantages. For example, since the driving TFT has a wide channel width and a short channel length, the driving thin film transistor can efficiently operate and drive the organic electroluminescent diode. Further, although a large amount of current flows through the driving thin film transistor, the current stress is prevented in the driving TFT because the driving TFT has parallel-connected sub-TFTs. Therefore, the driving TFT is not damaged. Further, even if one of the sub-TFTs is damaged and malfunctioned, the driving TFT operable because the sub-TFTs are parallel connected. Since the organic electroluminescent display device is a top emission type, increased aperture ratio can be obtained. Accordingly, the organic electroluminescent display device according to the present invention can have high resolution and excellent display quality.

It will be apparent to those skilled in the art that various modifications and variations can be made in the organic electroluminescent display device and method of fabricating an organic electroluminescent display device of the present invention without departing from the spirit or scope of the invention. Thus, it is intended that the present invention cover the modifications and variations of this invention provided they come within the scope of the appended claims and their equivalents.

What is claimed is:

1. An organic electroluminescent display device, comprising:
    a substrate;
    a gate line on the substrate;
    a data line crossing the gate line over the substrate;
    a switching thin film transistor near the crossing of the gate line and data line;
    a driving thin film transistor system including a plurality of sub-TFTs connected in parallel to the switching thin film transistor via a gate base;
    a power line crossing the gate line over the substrate and electrically connected with the plurality of sub-TFTs;
    a first electrode over the driving thin film transistor system in contact with the plurality of sub-TFTs;
    an organic electroluminescent layer on the first electrode; and
    a second electrode of transparent material on the organic electroluminescent layer,
    wherein the driving thin film transistor system includes first to fourth sub-TFTs having first to fourth driving gate electrodes, first to fourth driving source electrodes, first to fourth driving drain electrodes, and first to fourth active layers, and wherein the third driving drain electrode and the fourth driving drain electrode include one united body.

2. The device according to claim 1, wherein the switching thin film transistor includes a switching gate electrode extending from the gate line, a switching source electrode extending from the data line, a switching drain electrode spaced apart from the switching source electrode, and a switching active layer between the switching gate electrode and the switching source and drain electrodes.

3. The device according to claim 2, wherein the switching drain electrode of the switching thin film transistor is connected to the gate base.

4. The device according to claim 1, wherein the first to fourth driving gate electrodes are connected to the gate base to electrically connect the driving thin film transistor system to the switching thin film transistor.

5. The device according to claim 1, wherein the first driving drain electrode and the second driving drain electrode include one united body.

6. The device according to claim 5, wherein the first electrode contacts a middle of the one united body of the first and second driving drain electrodes.

7. The device according to claim 1, wherein the second driving source electrode and the third driving source electrode include one united body.

8. The device according to claim 1, wherein the first electrode contacts a middle of the united body of the third and fourth driving drain electrodes.

9. The device according to claim 1, wherein each of the first to fourth driving drain electrodes is spaced apart from each of the first to fourth driving source electrodes.

10. The device according to claim 7, further comprising power electrodes extending from the power line over the first to fourth driving source electrodes and electrically connected with the first to fourth source electrodes.

11. The device according to claim 10, wherein a first power electrode contacts the first driving source electrode, wherein a second power electrode contacts a middle of the united body of the second and third driving source electrodes, and wherein a third power electrode contacts the fourth driving source electrode.

* * * * *